United States Patent [19]
Murasato et al.

[11] Patent Number: 5,534,717
[45] Date of Patent: Jul. 9, 1996

[54] EPITAXIAL WAFER FOR LIGHT-EMITTING DIODE

[75] Inventors: Shigetaka Murasato; Koichi Hasegawa, both of Chichibu, Japan

[73] Assignee: Showa Denko K.K., Tokyo, Japan

[21] Appl. No.: 429,771

[22] Filed: Apr. 27, 1995

[30] Foreign Application Priority Data

Sep. 12, 1994 [JP] Japan .................................. 6-217651
Dec. 13, 1994 [JP] Japan .................................. 6-309084

[51] Int. Cl.[6] .................................................. H01L 33/00
[52] U.S. Cl. .............................. 257/94; 257/101; 257/102
[58] Field of Search ............................ 257/94, 101, 202

[56] References Cited

U.S. PATENT DOCUMENTS 4,575,742  3/1986  Kohashi et al. ........................... 257/94
5,181,084  1/1993  Bommer et al. ........................... 257/94

OTHER PUBLICATIONS

L. Ralph Dawson, "High–efficiency graded–band–gap $Ga_{1-x}Al_xAs$ light–emitting diodes", Journal of Applied Physics, vol. 48, No. 6, Jun. 1977, pp. 2485–2492.
Edward S. Yang, "Fundamentals of Semiconductor Devices," 1978, pp. 168–169, McGraw-Hill.

Primary Examiner—Mark V. Prenty
Attorney, Agent, or Firm—Armstrong, Westerman, Hattori, McLeland & Naughton

[57] ABSTRACT

An epitaxial wafer for a light-emitting diode comprises an n-GaAs single crystal substrate on which a Si-doped n-$Ga_{1-x}Al_xAs$ epitaxial layer, a Si-doped p-$Ga_{1-y}Al_yAs$ active layer, and a p-$Ga_{1-z}Al_zAs$ window layer are epitaxially formed, and in which the window/layer has a Si concentration of below $1\times10^{18}$ $cm^{-3}$.

6 Claims, 3 Drawing Sheets

EPITAXIAL WAFER FOR LIGHT-EMITTING DIODE

BACKGROUND OF THE INVENTION

1. Field of the Invention

This invention relates to a GaAs system high-output epitaxial wafer for infrared light-emitting diodes.

2. Description of the Prior Art

Wafers on which a GaAs or GaAlAs p-n junction is epitaxially formed on a GaAs substrate are extensively used for infrared light-emitting diodes (LEDs) used as light sources in photocouplers, remote controllers, and other such devices. Examples of the use of GaAs p-n junctions are described in National Technical Report, Vol. 18, No. 3, 1972, pages 249 to 258, and in JP-A 59-121830, for example. Examples of the use of GaAlAs p-n junctions include those described by the Journal of Applied Physics, Vol. 48 No. 6, Jun. 1977, and JP-A 6-21507. In an LED comprised of GaAlAs formed by adding Al to the GaAs p-n junction, the emission wavelength has been adjusted towards the short wavelength side of the spectrum. Among such infrared light-emitting diodes, there are those, such as the ones described by JP-A 59-121830 and JP-A 6-21507, with a window structure that provide a high output and are increasingly in demand for remote control applications. These window type light-emitting diodes are comprised of p-n junction on a GaAs substrate, which is then overlaid with a window layer of $Ga_{1-z}Al_zAs$ having a larger bandgap, confining injected electrons through the p-n junction into a p-type active layer where the light is generated. The transparency of the $Ga_{1-z}Al_zAs$ window layer to the emitted light is utilized to increase the external light output efficiency. (See for example "Fundamentals of Semiconductor Devices" by E. S. Yang, 1978, pp168–169, McGraw-Hill.)

In such light-emitting diodes, single-step liquid-phase epitaxy using the spontaneous dopant Si is used to form the GaAs or GaAlAs p-n junction region in a continuous process. This is because when GaAs is formed by liquid-phase epitaxy with Si as a dopant, high temperature formation results in n-type crystal, and low temperature formation results in p-type crystal. This means that with the same epitaxy solution, it is possible to grow an n-type layer and a p-type layer in a continuous operation, so productivity is high and the resultant p-n junction has good crystallinity. The emission wavelength of GaAs doped with Si depends on the concentration of the Si, but typically is from 930 to 950 nm, a wavelength that is particularly suitable for remote control light source applications.

In the GaAs the Si forms a deep acceptor level. Light emission is produced in the p-GaAs active layer by the recombination process in the region between the GaAs conduction band and the Si acceptor level. As a result, with a peak emission wavelength of from 930 to 950 nm, the emission energy of Si-doped p-GaAs is less than that of the GaAs bandgap (1.42 eV, corresponding to a wavelength of around 870 nm).

For a window layer, a material is used that has a higher bandgap energy than the active layer. GaAlAs mixed crystal formed by adding Al to GaAs, has a higher bandgap energy than GaAs, and when used as a window layer for a GaAs active layer, effectively confines injected electrons and is transparent to the emitted light. Also, a window effect can be provided using GaAlAs having a higher Al content compared to the GaAlAs active layer. Accordingly, a high Al content GaAlAs window layer is used in GaAs and GaAlAs LEDs. When a window layer has the same conduction type as the active layer and the active layer is formed by the single-step growth process using Si, a window layer in which Si is used as the dopant is widely employed. This is because Si has a low vapor pressure at a temperature around the epitaxial growth temperature, which makes it relatively easy to handle, and carrier concentration in the window layer can be controlled with good precision.

A $Ga_{1-z}Al_zAs$ window layer has to have a composition that does not absorb emitted light from the active layer. In the case of a $Ga_{1-z}Al_zAs$ window layer in which Si is used as the dopant, emitted light is absorbed toward the short wavelength side from the wavelength corresponding to the energy between the $Ga_{1-z}Al_zAs$ conduction band and the Si acceptor level. If z is 0.1, the wavelength corresponding to the energy between the $Ga_{1-z}Al_zAs$ conduction band and the Si acceptor level is around 860 nm. In the case of a GaAs active layer (that is, $Ga_{1-y}Al_yAs$, when y=0), with a z of 0.1 or more substantially none of the light will be absorbed by the window layer, but with a z that is less than 0.1, light starts to be absorbed by the window layer. As such, when a GaAs active layer is used it is necessary for z to be at least 0.1 over the entire window layer to prevent absorption by the window layer. In practice the window layer is formed by the liquid-phase epitaxial method, and because of the high segregation coefficient of Al, z is largest at the interface with the active layer, gradually decreases toward the epitaxial layer surface, and is at its smallest at the window layer surface. Therefore the z value is set at not less than 0.1 at the interface with the p-type epitaxial layer. Based on the same type of consideration, when the active layer is formed of $Ga_{a-y}Al_yAs$ (where y≠0), the Al mixing ratio z at the surface of the window layer has to be at least 0.1 more than y to prevent absorption by the window layer.

However, making the Al mixing ratio z at the surface of the window layer larger than 0.1 produces a rise in the forward voltage, one of an LED's important characteristics. In an LED a low forward voltage is preferable. For LEDs that are used as the light source for remote control applications, a low forward voltage is particularly important owing to the fact that they are battery driven. When Si is used as the window layer dopant, it is extremely difficult to reduce the forward voltage while at the same time preventing any absorption by the window layer.

When Si, which is an amphoteric dopant, as mentioned above, is used as the dopant in a p-$Ga_{1-z}Al_aAs$ window layer, epitaxial growth conditions are used so that p-type Si is produced. However, in the initial stage of the window layer formation process, small, local variations in the growth conditions can readily cause an n-type conductivity inversion in parts. Parts that have undergone n-type conductivity inversion are defective and reduce product yield.

When a GaAs p-n junction is formed using the single-step growth process using Si, carrier concentration in the vicinity undergoes a major decrease. Thus, even a slight change in the growing atmosphere can result in the formation of a zigzag junction (105), as indicated in FIG. 4 by arrow (b), degrading device characteristics. A zigzag junction extends across the entire wafer and is several tens of μm in size, although large ones may measure several hundred μm. An LED epitaxial wafer is cleaved into chips after electrodes have been formed on each surface of the wafer. The chips are generally 250 to 350 μm wide. A normal p-n junction is like the clear p-n junction indicated by arrow (a) in FIG. 4. When a chip is within a large zigzag junction, the result is a p-n-p-n junction extending from the p-GaAs layer (103) to the n-GaAs layer (102), indicated in FIG. 4 by arrow Co), and a device that does not function properly.

An object of the present invention is to provide an epitaxial wafer for a light-emitting diode with a window layer in which Si concentration is kept low and in which there is substantially no light absorption by Si dopant in the window layer.

Another object of the present invention is to provide an epitaxial wafer in which slight variation in epitaxial process conditions used in p-n junction formation does not give rise to inverted p-n portions, reducing the formation of a zigzag junction in the vicinity of the p-n junction.

Still another object of the present invention is to provide an epitaxial wafer in which a p-GaAlAs window layer is prevented from being partially inverted into an n-GaAlAs crystal.

A further object of the present invention is to provide an epitaxial wafer having a low forward voltage and a high emission efficiency without increasing the window layer surface Al mixing ratio.

SUMMARY OF THE INVENTION

To attain the above object, the present invention provides an epitaxial wafer for a light-emitting diode, comprised by an n-GaAs single crystal substrate on which are sequentially formed a Si-doped n-$Ga_{1-x}Al_xAs$ epitaxial layer, a Si-doped p-$Ga_{1-y}Al_yAs$ active layer, and a p-$Ga_{1-z}Al_zAs$ window layer having a Si concentration of below $1\times10^{18}$ $cm^{-3}$.

The object is also attained by an epitaxial wafer comprised as described above, in which Al mixing ratio x at the interface between the n-$Ga_{1-x}Al_xAs$ layer and the GaAs substrate is $0.001 \leq x \leq 0.1$.

The object is also attained by an epitaxial wafer comprised as described above, in which Al mixing ratio y in the p-$Ga_{1-y}Al_yAs$ layer is $0 < y \leq 0.02$.

The object is also attained by an epitaxial wafer comprised $cm^{-3}$. layer is Zn and the carrier concentration is from $1\times10^{17}$ $cm^{-3}$ to $1\times10^{19}$ $cm^{-3}$.

The object is also attained by an epitaxial wafer comprised as described above, in which the carrier concentration in the n-$Ga_{1-x}Al_xAs$ and p-$Ga_{1-y}Al_yAs$ layers is from $1\times10^{15}$ to $3\times10^{18}$ $cm^{-3}$.

As described above, when the p-$Ga_{1-z}Al_zAs$ window layer with Si is given a Si concentration that does not exceed $1\times10^{18}cm^{-3}$, light is not absorbed by Si acceptors even if the Al mixing ratio z at the surface of the window layer is reduced nearly to zero. Moreover, since there is a low Al mixing ratio, the forward voltage does not become high. When Zn is used as the dopant in the p-$Ga_{1-z}Al_zAs$ window layer, as the Zn only functions as a p-type dopant, Zn prevents a portion of the p-GaAlAs window layer from inversioning to n-GaAlAs crystal. It also makes it relatively easy to control the carrier concentration and improve the product yield.

Furthermore, when GaAs is being epitaxially formed using n-to-p inversion of Si in the single-step epitaxial growth process, adding Al so that the Al mixing ratio x at the interface between the n-$Ga_{a-x}Al_xAs$ epitaxial layer and the GaAs substrate is not less than 0.001 greatly reduces the formation of zigzag junctions, and even if a zigzag junction does form, it is so small that it has substantially no effect on device function.

The above and other features of the present invention will become apparent from the following description made with reference to the drawings.

DESCRIPTION OF THE PREFERRED EMBODIMENT

Figure 1:
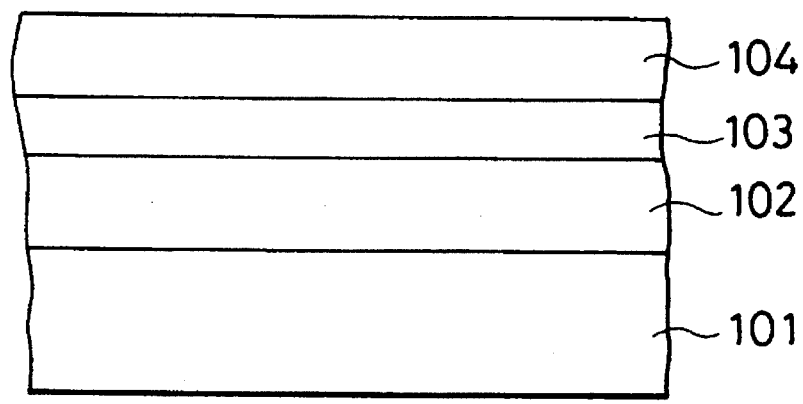
FIG. 1 shows the arrangement of the epitaxial wafer of this invention.
Figure 5:
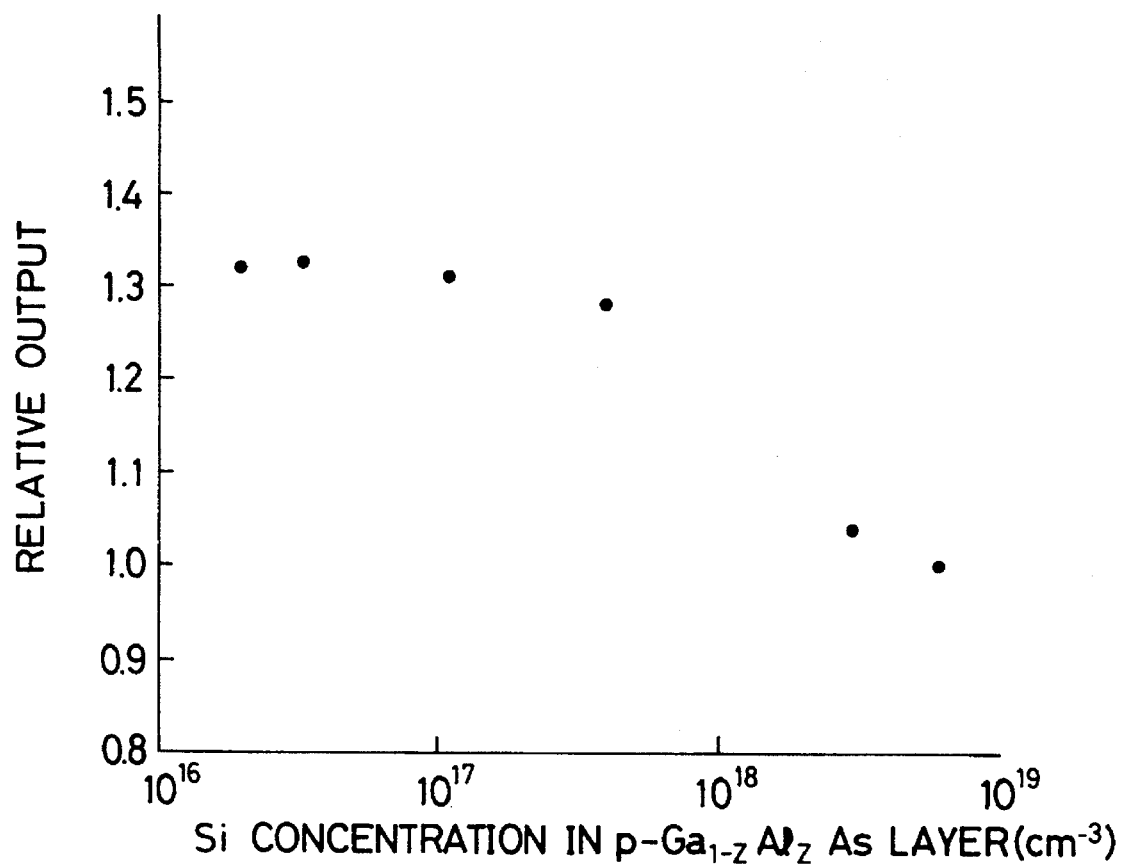
FIG. 5 shows the relationship between Si concentration in the p-$Ga_{1-z}Al_zAs$ window layer and light emitting output.

FIG. 1 shows an embodiment of an infrared light-emitting diode epitaxial wafer according to the present invention, comprising an n-GaAs single crystal substrate 101 on which are formed a Si-doped n-$Ga_{a-x}Al_xAs$ epitaxial layer 102, a Si-doped p-$Ga_{a-y}Al_yAs$ active layer 103 and a p-$Ga_{1-z}Al_zAs$ window layer 104. As a result of numerous experiments, the inventors found that by keeping the Si concentration in the window layer 104 down to a very low level and using Zn as the dopant, an LED epitaxial wafer can be obtained that possesses high emission efficiency and low forward voltage. The results of an investigation of the relationship between Si concentration and light emitting output are shown in FIG. 5. Specifically, FIG. 5 shows the relationship between the light output and the concentration of Si in a p-$Ga_{1-z}Al_zAs$ window layer 104 in the case of a GaAs p-n junction having an Al mixing ratio value z of 0.23 at the interface with the active layer 103, and a z of 0.05 at the surface of the window layer. As shown in FIG. 5, at a Si concentration of $1\times10^{18}$ $cm^{-3}$ the relative light output was about 1.2, and with a Si concentration of $1\times10^7$ $cm^{-3}$ the output was over 1.3, confirming that there was substantially no light absorption by Si acceptors.

With a Si concentration that does not exceed $1\times10^{18}$ $cm^-$, emitted light is not absorbed by Si acceptors even if the Al mixing ratio z at the surface of the window layer is reduced to nearly zero. When the same experiments were conducted when $x \neq 0$ and $y \neq 0$, it was found that by reducing the window layer Si concentration to below $1\times10^{18}$ $cm^{-3}$, and more preferably to below $1\times10^{17}$ $cm^{-3}$, there was almost no absorption by Si acceptors even when the Al mixing ratio z at the surface of the window layer was reduced to around the same level as y. Thus, by reducing the window layer Si concentration to below $1\times10^{18}$ $cm^{-3}$, and more preferably to below $1\times10^{17}$ $cm^{-3}$, the Al mixing ratio at the surface of the window layer can be decreased, reducing the forward voltage and preventing light absorption by the window layer. The actual lower limit for the Si concentration is $10^{15}$ $cm^{-3}$.

Here, Si concentration means the concentration of Si itself, not the carrier concentration. Si is an amphoteric dopant; Si donors and Si acceptors are both present in GaAs or GaAlAs, in a compensation relationship. The difference between the concentration of acceptors and the concentration of donors that include Si is the carrier concentration. Thus, it is Si concentration that is specified here, not carrier concentration. The Si concentration can be measured by SIMS analysis or the like.

Zn can be used as the window layer 104 dopant. Zn is advantageous because, unlike Si, Zn does not form a deep acceptor level. Also, it is relatively easy to control the carrier concentration, providing good reproducibility of a desired carrier concentration. Again, while Si is an amphoteric dopant, Zn is not and functions only as a p-type dopant, which means that with Zn there are no n inversions. Good characteristics can be obtained by using a window layer carrier concentration of from $1\times10^{17}$ cm$^{-3}$ to $1\times10^{19}$ cm$^{-3}$. Good ohmic contact cannot be obtained with a carrier concentration below $1\times10^{17}$ cm$^{-3}$, while a concentration that is higher than $1\times10^{19}$ cm$^{-3}$ has an adverse effect on the crystallinity of the window layer. Even if the Si in the p-Ga$_{1-z}$Al$_z$As window layer is not used as a p-type dopant, it can become mixed in during the epitaxial forming process, either because the melt used in the forming of the p-Ga$_{1-y}$Al$_y$As active layer cannot be completely removed, or because of a partial melt-back of the p-Ga$_{1-y}$Al$_y$As active layer. There are also cases of it entering from Ga metal, one of the components of the epitaxial solution. Strict supervision of the epitaxial process is therefore important, to keep down the amount of Si in the window layer.

Thus, as described above, in the window layer the Si concentration is kept to below $1\times10^{18}$ cm$^{-3}$, and more preferably to below $1\times10^{17}$ cm$^{-3}$, Zn is used as the dopant and the carrier concentration is set at between $1\times10^{17}$ cm$^{-3}$ and $1\times10^{19}$ cm$^{-3}$. The Al mixing ratio z at the interface with the p-Ga$_{1-y}$Al$_y$As active layer 103 is made larger than y, preferably (y+0.1)<z. The Al mixing ratio z at the window layer surface is preferably y≦z <(y+0.1).

Based on extensive studies into ways of preventing the formation of zigzag junction portions caused by n-to-p Si inversion during p-n junction formation, the inventors found that zigzag junction formation could be suppressed by adding Al to the GaAs. Specifically, by adding sufficient Al to the epitaxial growth solution used to form GaAs by the single-step growth process using Si to ensure an Al mixing ratio x of not less than 0.001 at the interface between the n-Ga$_{1-x}$Al$_x$As epitaxial layer 102 and the substrate 101, the formation of zigzag junctions can be greatly decreased, and those that do form are extremely small. With an Al mixing ratio x that is less than 0.001, no clear zigzag junction reduction effect is observed. With an Al mixing ratio x of 0.001 or more, a higher x value provides a stronger effect with respect to suppressing zigzag formation. However, adding Al to GaAs increases the bandgap, causing the peak emission wavelength to undergo a shift to a shorter wavelength. This is not a problem in the case of applications that are unaffected by a shorter wavelength. However, a shortening of the wavelength is disadvantageous if the light-emitting diode is to be used as a remote control light source or the like, and as such, it is necessary to adjust the Al mixing ratio to achieve the prescribed wavelength.

To achieve a peak emission wavelength of 930 to 950 nm, the Al mixing ratio y in the p-Ga$_{1-y}$Al$_y$As active layer 103 has to be 0.02 or less. When the liquid-phase method is used in the epitaxial growth process, because Al has a high segregation coefficient, the Al mixing ratio steadily diminishes in the growth direction. When Si inversion is used to form the n-Ga$_{1-x}$Al$_x$As epitaxial layer 102 and the p-Ga$_{1-y}$Al$_y$As active layer 103 in a continuous process, it is necessary to set the Al mixing ratio x at the start of the n-Ga$_{1-x}$Al$_x$As epitaxial layer formation to reach the target Al composition for the p-Ga$_{1-y}$Al$_y$As active layer. Various conditions were studied, and it was found that if an Al mixing ratio x of 0.1 or more was set at the start of formation of the n-Ga$_{1-x}$Al$_x$As epitaxial layer, that is, in the vicinity of the interface with the n-GaAs substrate, it was difficult to control the p-Ga$_{1-y}$Al$_y$As active layer Al mixing ratio y to 0.02 or below.

Based on these results, it was found that using an Al mixing ratio x of 0.001<x≦0.1 with respect to the vicinity of the interface between the n-Ga$_{1-x}$Al$_x$As epitaxial layer and the n-GadAs substrate, and an Al mixing ratio y of 0<y≦0.02 for the p-Ga$_{1-y}$Al$_y$As active layer, provided a peak emission wavelength of from 930 to 950 nm and made it possible to obtain an epitaxial wafer having a good quality p-n junction with very few zigzag portions. For applications that do not require the peak emission wavelength to be controlled to within 930 to 950 nm, an epitaxial wafer having a good quality p-n junction with very few zigzag portions can be obtained by specifying just 0.001<x≦0.1.

Other requirements will now be described, in order.

The substrate is formed of GaAs single crystal. Normally Si-doped n-GaAs is used. In addition to Si, Te, Sn, Se, S or any other such substance having a donor function in GaAs may be used as the dopant. A carrier concentration of from $1\times10^{17}$ cm$^{-3}$ to $3\times10^{18}$ cm$^{-3}$ is appropriate. A crystal plane orientation in the formation direction of (100) or (111) is used.

The n-Ga$_{1-x}$Al$_x$As epitaxial layer is a buffer layer that eliminates the effect of crystal defects in the substrate, facilitating the smooth formation of the active layer crystal, and also serves to inject electrons into the p-n junction, and therefore needs to be from 20 to 100 µm thick. The carrier concentration used is from $1\times10^{15}$ cm$^{-3}$ to $3\times10^{18}$ cm$^{-3}$, and more preferably is from $1\times10^{17}$ cm$^{-3}$ to $1\times10^{18}$ cm$^{-3}$. The n-Ga$_{1-x}$Al$_x$As epitaxial layer may be formed using GaAs with no added Al (x=0), or Ga$_{1-x}$Al$_x$As with added Al (x ≠0). As mentioned above, the addition of Al has the effect of suppressing the zigzag junction formations, but in order to stay within the target values for the active layer, the Al mixed crystal ratio x at the interface with the GaAs substrate should be held to from 0.001 to 0.1.

The p-Ga$_{1-y}$Al$_y$As active layer forms a p-n junction with the n-Ga$_{1-x}$Al$_x$As epitaxial layer. The p-Ga$_{1-y}$Al$_y$As active layer also may be formed using GaAs with no added Al (y=0), or Ga$_1$Al$_y$As with added Al (y ≠0). When Al is added and the intended applications are limited to an emission wavelength of 930 to 950 nm, it is necessary to use an Al mixed crystal ratio y that does not exceed 0.02. After the formation of the n-Ga$_{1-x}$Al$_x$As epitaxial layer, the formation process continues with the formation of the p-Ga$_{1-y}$Al$_y$As layer, so the Al mixing ratio x at the interface with the GaAs substrate should be adjusted to 0.001≦x≦0.1. A carrier concentration should be used that is from $1\times10^{15}$ cm$^{-3}$ to $3\times10^{18}$ cm$^{-3}$, more preferably from $1\times10^{17}$ cm$^{-3}$ to $1\times10^{18}$ cm$^{-3}$, almost the same as that of the n-Ga$_{1-x}$Al$_x$As epitaxial layer.

When there is no window layer, if the thickness of the p-Ga$_{1-y}$Al$_y$As active layer is less than the diffusion length of the injected carriers, central recombination in the surface captures most of the injected carriers and there is a decrease in the internal quantum efficiency and light output also declines. Therefore, a thickness is used that is exceeds the diffusion length of injected carriers. When Si as used as the dopant in the p-Ga$_{1-y}$Al$_y$As active layer, the carrier diffusion is around 80 µm, which should mean that the p-Ga$_{1-y}$Al$_y$As active layer has to be at least 80 µm thick. However, an essential part of this invention is a window layer, and as the window layer also has a confinement effect, a p-Ga$_{1-y}$Al$_y$As layer that is thinner than 80 µm can be used. Thus, a p-Ga$_{1-y}$Al$_y$As active layer thickness of from 5 to 80 µm may be used, and more preferably a thickness of from 10 to 30 µm.

In the LED epitaxial wafer of this invention, comprising an n-Ga$_{1-x}$Al$_x$As layer and a p-Ga$_{1-y}$Al$_y$As layer having a p-Ga$_{1-z}$Al$_z$As window layer structure, using a Si concentration in the p-Ga$_{1-z}$Al$_z$As window layer of below $1\times10^{18}$ cm$^{-3}$, prevents the emitted light being absorbed by the Si.

This makes it possible to obtain an epitaxial wafer for light-emitting diodes in which the surface Al mixing ratio z of the p-$Ga_{1-z}Al_zAs$ window layer can be reduced, providing high emission efficiency and low forward voltage. Also, using Zn as the dopant for the window layer instead of the amphoteric Si enables p-to-n inversion in the p-type $Ga_{1-z}Al_zAs$ window layer to be prevented. With respect to the GaAs p-n junction formed using the n-to-p inversion of Si, while it is not clear what causes zigzag junctions to form, it has been clarified that adding small amounts of Al to the GaAs reduces zigzag function formations.

Example 1

N-to-p inversion of Si was utilized to form an n-GaAs epitaxial layer on an n-GaAs substrate, followed by a p-GaAs active layer, using single-step liquid-phase epitaxy. Liquid-phase epitaxy was then used to form a p-$Ga_{1-z}As$ window layer on the active layer. The n-GaAs single crystal substrate used was doped with Si and given a carrier concentration of $3 \times 10^{17}$ $cm^{-3}$ and a (100) crystal plane orientation. A standard sliding boat forming technique was used. A first melt container was charged with a solution of the requisite GaAs polycrystal for the Ga metal with added Si used to form the n-GaAs epitaxial layer and the p-GaAs active layer. For the p-$Ga_{1-z}Al_zAs$ window layer, a second melt container was charged with a solution of the requisite GaAs polycrystal for the Ga metal to which Al and Zn were added. Table 1 shows the composition of the solution.

Figure 2:
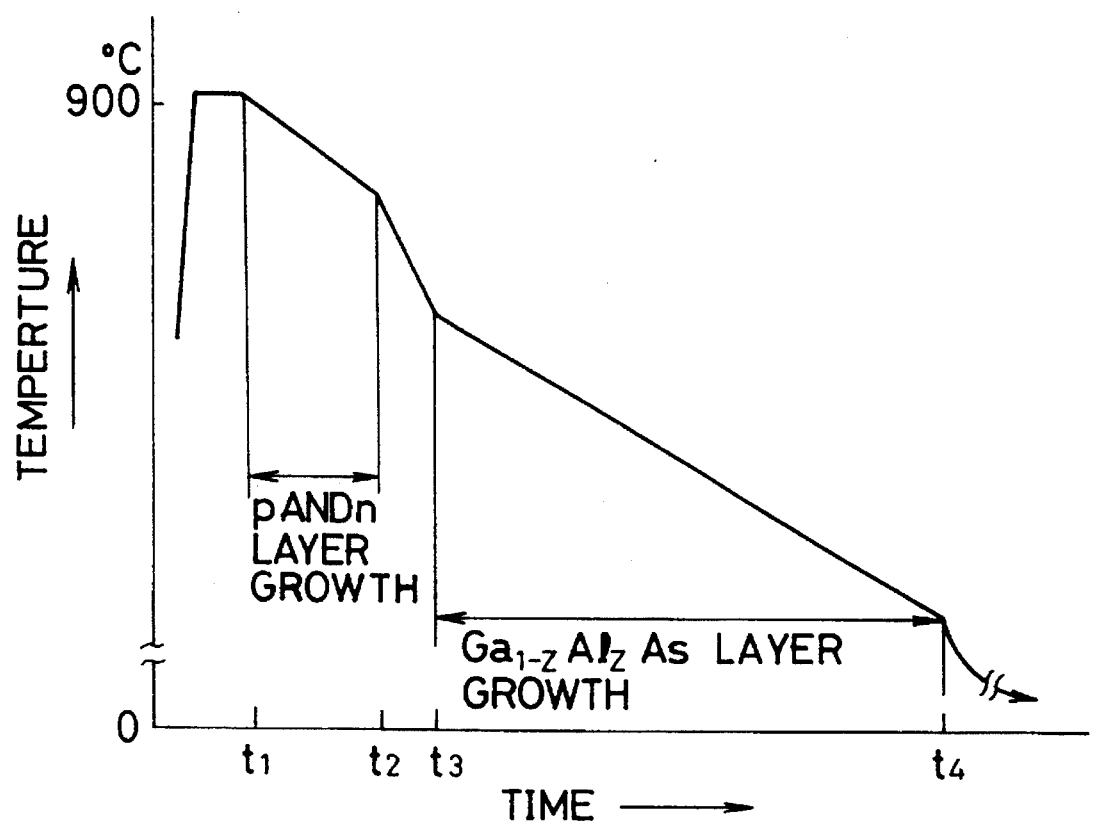
FIG. 2 illustrates the epitaxial growth temperature profile used in a first embodiment of the invention.
Figure 3:
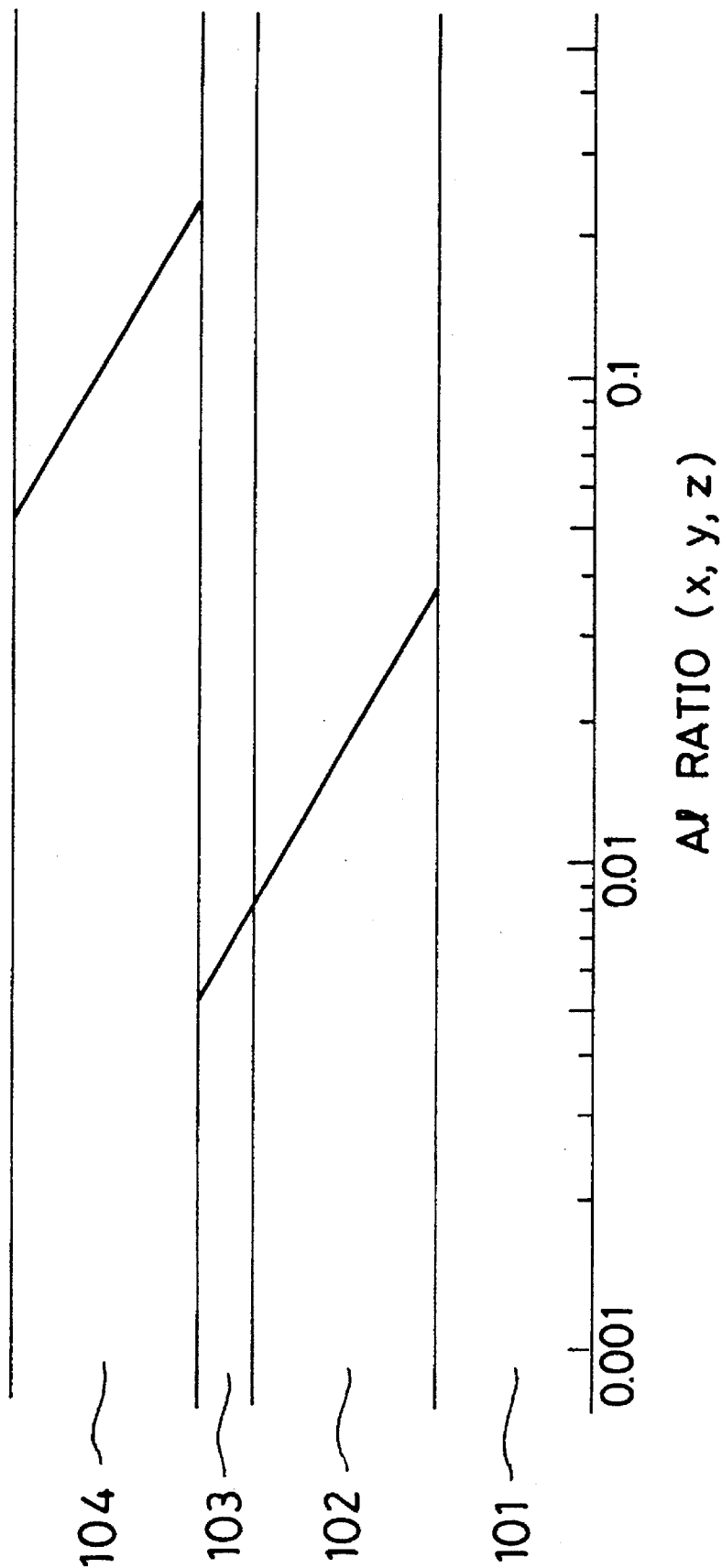
FIG. 3 shows the Al concentration profile in a third embodiment of the invention.
Figure 4:
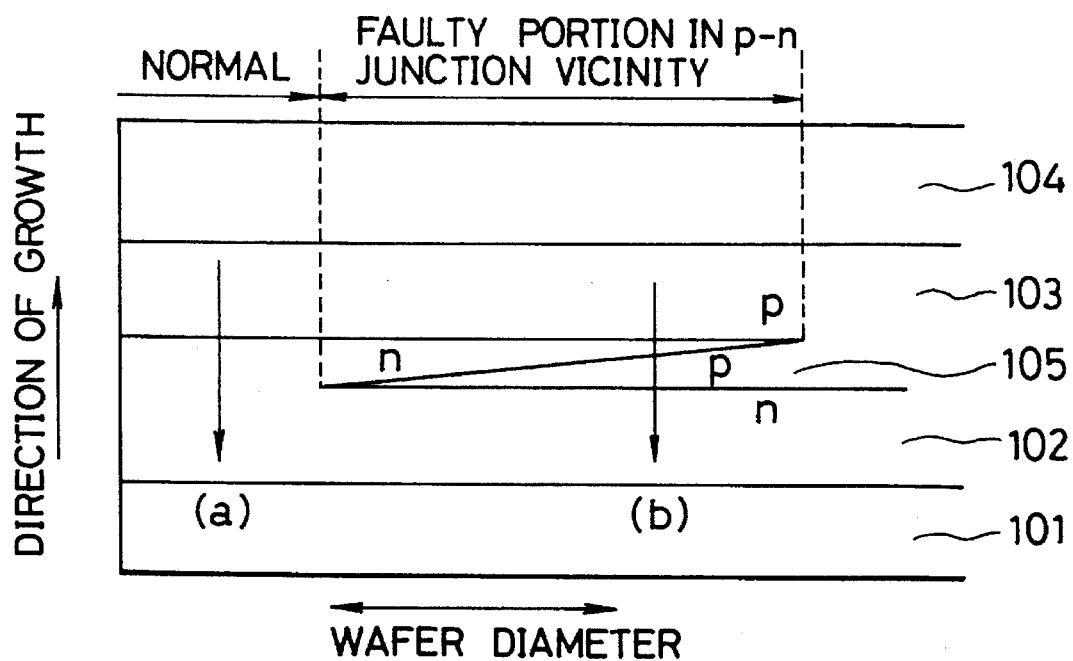
FIG. 4 shows a zigzag formation in the vicinity of a p-n junction, with (a) indicating a normal junction and (b) a zigzag junction.

The sliding boat was placed in a furnace and the temperature controlled in accordance with the profile of FIG. 2, and the substrate was brought into contact with the first solution while at the same time blowing through high-purity hydrogen gas, to form the n-GaAs epitaxial layer and the p-GaAs active layer in a continuous single-step growth process.

Next, the substrate was brought into contact with the second solution and the p-$Ga_{1-z}Al_zAs$ window layer was formed, using the temperature profile of FIG. 2. The properties of the wafer thus formed by the above epitaxial processes were evaluated. Carrier concentration was measured by the CV method. SIMS was used to measure the Si concentration. A cleaved face of the wafer was etched and stained and the wafer was microscopically examined for zigzag junction formation. The results were as follows.

Thickness of n-GaAs epitaxial layer: 46 μm.

Thickness of p-GaAs epitaxial layer: 20 μm.

The p-$Ga_{1-z}Al_zAs$ window layer had a thickness of 53 μm, a carrier concentration of $2 \times 10^{18}$ $cm^{-3}$; Al mixing ratio z was 0.23 at the interface with the p-GaAs epitaxial layer and 0.05 at the layer surface. Si concentration was $2 \times 10^{16}$ $cm^{-3}$. The properties of each layer are listed in Table 2.

TABLE 1

|  | Example 1 | Example 2 | Example 3 | Example 4 | Example 5 | Comparative Example 1 | Comparative Example 2 |
|---|---|---|---|---|---|---|---|
| No. 1 Melt Container |  |  |  |  |  |  |  |
| Ga (g) | 100 | 100 | 100 | 100 | 100 | 100 | 100 |
| GaAs (g) | 15 | 15 | 15 | 15 | 15 | 15 | 15 |
| Al (mg) | — | 3 | 12 | 24 | 48 | — | — |
| Si (mg) | 300 | 300 | 300 | 300 | 300 | 300 | 300 |
| No. 2 Melt Container |  |  |  |  |  |  |  |
| Ga (g) | 100 | 100 | 100 | 100 | 100 | 100 | 100 |
| GaAs (g) | 6 | 6 | 6 | 6 | 6 | 6 | 6 |
| Al (mg) | 120 | 120 | 120 | 120 | 120 | 120 | 120 |
| Zn (mg) | 150 | 150 | 150 | 150 | 150 | — | — |
| Si (mg) | — | — | — | — | — | 200 | 200 |

TABLE 2

|  | Example 1 | Example 2 | Example 3 | Example 4 | Example 5 | Comparative Example 1 | Comparative Example 2 |
|---|---|---|---|---|---|---|---|
| n-$Al_xGa_{1-x}As$ epitaxial layer |  |  |  |  |  |  |  |
| Thickness (μm) | 46 | 47 | 46 | 45 | 46 | 43 | 44 |
| Al ratio x at substrate interface | — | 0.011 | 0.037 | 0.053 | 0.093 | — | — |
| p-$Al_yGa_{1-y}As$ active layer |  |  |  |  |  |  |  |
| Thickness (μm) | 20 | 19 | 19 | 17 | 14 | 22 | 20 |
| Al ratio y | — | 0.0017 | 0.0064 | 0.0097 | 0.017 | — | — |
| p-$Al_zGa_{1-z}As$ window layer |  |  |  |  |  |  |  |

TABLE 2-continued

|  | Example 1 | Example 2 | Example 3 | Example 4 | Example 5 | Comparative Example 1 | Comparative Example 2 |
|---|---|---|---|---|---|---|---|
| Thickness (μm) | 53 | 51 | 51 | 51 | 51 | 50 | 36 |
| Al ratio z at active layer interface | 0.23 | 0.23 | 0.23 | 0.23 | 0.23 | 0.22 | 0.31 |
| Al ratio z at window layer interface | 0.05 | 0.05 | 0.05 | 0.05 | 0.05 | 0.05 | 0.12 |
| Si concentration ($\times 10^{15} cm^{-3}$) | 2 | 2 | 2 | 2 | 2 | 600 | 600 |
| Carrier concentration ($\times 10^{18} cm^{-3}$) | 2 | 2 | 2 | 2 | 2 | 5 | 5 |
| p-n junction zigzag deformations | Many, large | | Few, small | | | Many, large | Many, large |

Au ohmic contacts were then formed on each surface, the wafer was cleaved at a pitch of 300 μm, and properties with respect to application as LED devices were evaluated. The relative light output is relative to the light output of an LED with a Si-doped window layer listed as comparative example 1, which is taken as 1.00. Forward voltage ($V_F$) was measured at $I_F$=20 mA. As a result, the emission wavelength was found to be 946 nm and the relative light output 1.32. The properties of the LEDs are listed in Table 3. The zigzag junction based device defect rate is relative to a defect rate of 1 in the case of comparative example 1.

COMPARATIVE EXAMPLE 2

The second melt container was charged with a solution of the requisite GaAs polycrystal for the Ga metal to which Al in an amount larger than that of the Al added in Comparative Example 1 and Si were added, and epitaxial growth was then effected by the same procedure. The properties and LED properties of the epitaxial wafer thus formed with a Si-doped window layer are listed in Tables 2 and 3.

TABLE 3

|  | Example 1 | Example 2 | Example 3 | Example 4 | Example 5 | Comparative Example 1 | Comparative Example 2 |
|---|---|---|---|---|---|---|---|
| Relative output | 1.32 | 1.33 | 1.35 | 1.34 | 1.34 | 1.00 | 1.30 |
| Emission wavelength (nm) | 946 | 943 | 940 | 938 | 931 | 945 | 944 |
| Forward voltage ($V_F$) ($I_p$ = 20 mA) | 1.18 | 1.18 | 1.19 | 1.18 | 1.18 | 1.19 | 1.23 |
| Defect rate (from zigzag junctions (Relative value) | 1.06 | 0.039 | 0.03 | 0.026 | 0.029 | 1 | 1.11 |

EXAMPLE 2

An epitaxial wafer was formed using the same process as that of Example 1, except that the solution in the first melt container also included Al. The composition of the wafer is shown in Table 1, wafer properties in Table 2, and LED properties in Table 3. The addition of Al to the part of the epitaxial layer where the p-n junction is formed resulted in a major decrease in the device defect rate owing to zigzag junction formation.

EXAMPLES 3 to 5

Epitaxial wafers were each formed using the same process as that of Example 1, except that more Al was added to the solution in the first melt container, as shown in Table 1, resulting in the wafer properties listed in Table 2. As in Example 1, LED properties were evaluated. The results are listed in Table 3.

COMPARATIVE EXAMPLE 1

The second melt container was charged with a solution of the requisite GaAs polycrystal for the Ga metal to which Al and Si were added. Epitaxial growth was then effected in the same way as in Example 1. The properties and LED properties of the epitaxial wafer thus formed with a Si-doped window layer are listed in Tables 2 and 3.

With reference to Table 3, a comparison of Example 1 and Comparative Example 1 shows that in the case of Example 1, using a window layer Si concentration not exceeding $1 \times 10^{17}$ cm$^{-3}$ resulted in an emitted light output that was approximately 1.3 higher. Also, a comparison of Example 1 and Comparative Example 2 shows that by raising Al mixing ratio in the window layer from 0.05 to z=0.12 at the window layer surface, Comparative Example 2 achieved an improvement in light emitting output comparable to that of Example 1, even with a Si concentration of over $1 \times 10^{17}$ cm$^{-3}$, the forward voltage ($V_F$) is 0.05 v higher than that of Example 1, which in practice makes it disadvantageous for device purposes. Although Example 1 has the same yield as Comparative Example 1, its low forward voltage means that it can be utilized for device purposes.

As can be seen from a comparison of Example 1, Comparative Example 1 and Comparative Example 2 in which the n-type epitaxial layer and p-type active layer does not include Al, with Examples 2 to 5 in which the n-type epitaxial layer and p-type active layer do include Al, shows that the defect rate caused by zigzag junction formations is much lower in the Examples 2 to 5 with the Al. Increasing the Al mixing ratio y in the p-$Ga_{1-y}Al_yAs$ active layer shifts the peak emission wavelength towards the shorter wavelength side of the spectrum. However, as the wavelength is within the range 930 to 950 nm, in practice this is not a problem.

Thus, in accordance with this invention, a high-output, low forward voltage infrared LED epitaxial wafer with a low incidence of zigzag junction formation can be obtained that provides a high yield, and operating in the 930 to 950 nm wavelength region, is particularly advantageous for use as a light source for remote control applications.

What is claimed is:

1. An epitaxial wafer for a light-emitting diode, comprised by an n-GaAs single crystal substrate on which are sequentially formed an n-$Ga_{1-x}Al_xAs$ epitaxial layer doped with Si, a p-$Ga_{1-y}Al_yAs$ active layer doped with Si, and a p-$Ga_{1-z}Al_zAs$ window layer having a Si concentration of below $1\times10^{17}$ cm$^{-3}$ and doped with Zn as p-type dopant so as to have a carrier concentration in the range of from $1\times10^{17}$ to $1\times10^{19}$ cm$^{-3}$, wherein Al mixing ratio x at an interface region between the epitaxial layer and the GaAs substrate is $0\leq x\leq 0.1$, Al mixing ratio y in the active layer is $0\leq y\leq 0.02$, and Al mixing ratio z is greater than y at an interface with the active layer and at a window layer surface is $y<z<(y+0.1)$.

2. An epitaxial wafer according to claim 1, wherein said Al mixing ratio x is $0.001\leq x\leq 0.1$.

3. An epitaxial wafer according to claim 1, wherein each of said Al mixing ratio y is $0<y\leq 0.02$.

4. An epitaxial wafer according to claim 1, wherein each of said epitaxial layer and said active layer has a carrier concentration in the range of from $1\times10^{15}$ cm$^{-3}$ to $3\times10^{18}$ cm$^{-3}$.

5. An epitaxial wafer according to claim 1, wherein said active layer has a thickness in the range of from 10 to 30 µm.

6. An epitaxial wafer according to claim 1, wherein said window layer has a thickness in the range of from 5 to 60 µm.

* * * * *